United States Patent [19]

Gawell et al.

[11] Patent Number: 5,059,873
[45] Date of Patent: Oct. 22, 1991

[54] MULTIPLE FREQUENCY VERTICAL SCAN SYSTEM

[75] Inventors: George R. Gawell, Mt. Prospect; Philip J. Nowaczyk, Chicago, both of Ill.

[73] Assignee: Zenith Electronics Corporation, Glenview, Ill.

[21] Appl. No.: 621,672

[22] Filed: Dec. 3, 1990

[51] Int. Cl.[5] .................. H01J 29/70; H01J 29/76
[52] U.S. Cl. .................................................. 315/403
[58] Field of Search ............... 315/396, 397, 403, 387

[56] References Cited

U.S. PATENT DOCUMENTS 4,945,292 7/1990 Ackerson et al. ............... 315/387
4,961,032 10/1990 Rodriguez-Cavazos ......... 315/395

Primary Examiner—Theodore M. Blum

[57] ABSTRACT

A display monitor includes a conventional cathode ray tube display and display drive. A conventional horizontal deflection system and high voltage system are operable to provide horizontal scan of the cathode ray tube and a high voltage potential therefor. A vertical deflection system suitable for multiple frequency and normal or expanded modes of operation includes a vertical oscillator and vertical amplifier driving a vertical deflection yoke. A sample of the vertical deflection signal is detected by an amplitude detector and compared to a reference amplitude to produce an error signal operative upon the vertical scan system. Individual reference voltages corresponding to normal and expanded modes of operation are selectively coupleable to the reference voltage portion of the system by a selector switch.

7 Claims, 3 Drawing Sheets

MULTIPLE FREQUENCY VERTICAL SCAN SYSTEM

FIELD OF THE INVENTION

This invention relates generally to cathode ray tube display systems and particularly to those used in computing systems.

BACKGROUND OF THE INVENTION

Computing systems generally use one or more display monitors to provide a visual input/output capability. While the structures of computer display monitors varies, all generally include a cathode ray tube (CRT) having an evacuated envelope usually made of high-strength glass. The envelope defines a generally flat or slightly curved faceplate together with a funnel shaped bell and extending neck. The interior side of the faceplate supports a phosphor display screen. In monochrome displays, a single electron gun is supported within the CRT neck and is directed toward the phosphor screen. The electron gun produces a beam of electrons which are directed toward the faceplate striking the phosphor screen and causing visible light to be emitted therefrom. In color display systems, a plurality of electron guns are used together with a phosphor screen which supports plural areas of phosphors having differing color light emitting characteristics. A shadow mask or similar structure is interposed between the electron guns and the phosphor screen to cause each of the electron guns to stimulate an associated type of colored light emitting phosphor.

Whether the display system is monochrome or color, the electrons emanating from the electron gun or guns form a CRT beam which is scanned in both the horizontal and vertical directions across the faceplate to form a raster. In most instances, the horizontal scan system is operative at a higher frequency than the vertical scan system. Thus, the horizontal scan moves the electron beam rapidly from side to side across the faceplate while the vertical scan system causes the successive horizontal scans to be moved progressively from top to bottom to complete a display frame and form the raster.

In the majority of the presently used display systems, electron beam scanning is accomplished by electromagnetic deflection of the CRT beam. A deflection yoke is supported upon the CRT envelope between the electron guns and the faceplate. The deflection yoke supports a plurality of deflection coils which are coupled to the horizontal and vertical scan systems. Horizontal and vertical scan signals provided by the respective scan systems are coupled to the windings of the deflection yoke to produce corresponding electromagnetic fields which bend the electron beam and thereby direct it to the desired portion of the CRT faceplate. Both the horizontal and vertical scan signals include longer duration sloped scan portions followed by shorter duration high amplitude retrace portions. The latter are utilized at the completion of each respective scan interval to return the electron beam to its starting position. In addition, the retrace portion of the horizontal scan signal is used to develop the high voltage necessary to accelerate the electron beam toward the CRT faceplate.

The character of the image displayed in a CRT display system results from variation or modulation of the intensity of the scanned CRT electron beam. This intensity modulation must be properly timed or synchronized to the horizontal and vertical rate scanning of the raster. Thus, as the electron beam is scanned across the faceplate to form a raster, the desired portions of the faceplate are illuminated by synchronized modulation of the electron beam to provide the desired image.

Most display monitors operate at constant scan frequencies and use a single image size format. Great care is taken to establish and maintain constant scan frequencies and precise relatively constant image size. However, it has been found desirable in certain applications to operate the monitor at one of several different scan frequencies. It is also advantageous to include the capability for expansion or enlargement of the displayed image to produce an enhanced more dramatic effect.

Image expansion is typically accomplished by deliberately inducing an "overscan" condition within the display monitor. Most monitors achieve overscan by simultaneous increase of the vertical and horizontal deflection currents driving the deflection yoke. In effect, the raster is scanned beyond the border or outer edge of the CRT faceplate. Systems having overscan capability are subject, however, to additional problems not encountered by single display size monitors. For example, the precise adjustment and maintenance of the multiple size formats is often difficult to achieve. Frequently, the size changing mechanism introduces inaccuracies in the size control systems tending to degrade overall performance of the display monitor.

Operation of the display monitor at a variety of scan frequencies usually creates undesired amplitude changes in the monitor deflection systems.

In vertical deflection systems, the amplitude of scan signal and scan frequency are interactively related due primarily to the use of saw forming capacitor networks to generate the basic scan signals. Such systems use switching type oscillators to repeatedly charge and discharge a saw forming capacitor at constant current rates. As a result, attempts to change frequency disturb amplitude and vice versa.

Despite the attendant problems, multiple frequency display monitors having expandable image capability are advantageous to the user. There remains, therefore, a need in the art for an inexpensive, efficient multiple frequency image expanding display system operable upon the vertical deflection systems of monitors which effectively provides for independent control of image size in a multiple frequency operating mode.

Accordingly, it is a general object of the present invention to provide an improved display monitor. It is a more particular object of the present invention to provide an improved display monitor having image expanding capability which substantially maintains image size stability in each mode of operation. It is a still more particular object of the present invention to provide a vertical scan system for use in a display monitor which is operable in an image expanded mode and which may be used at a variety of scan frequencies.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENT

Figure 1:
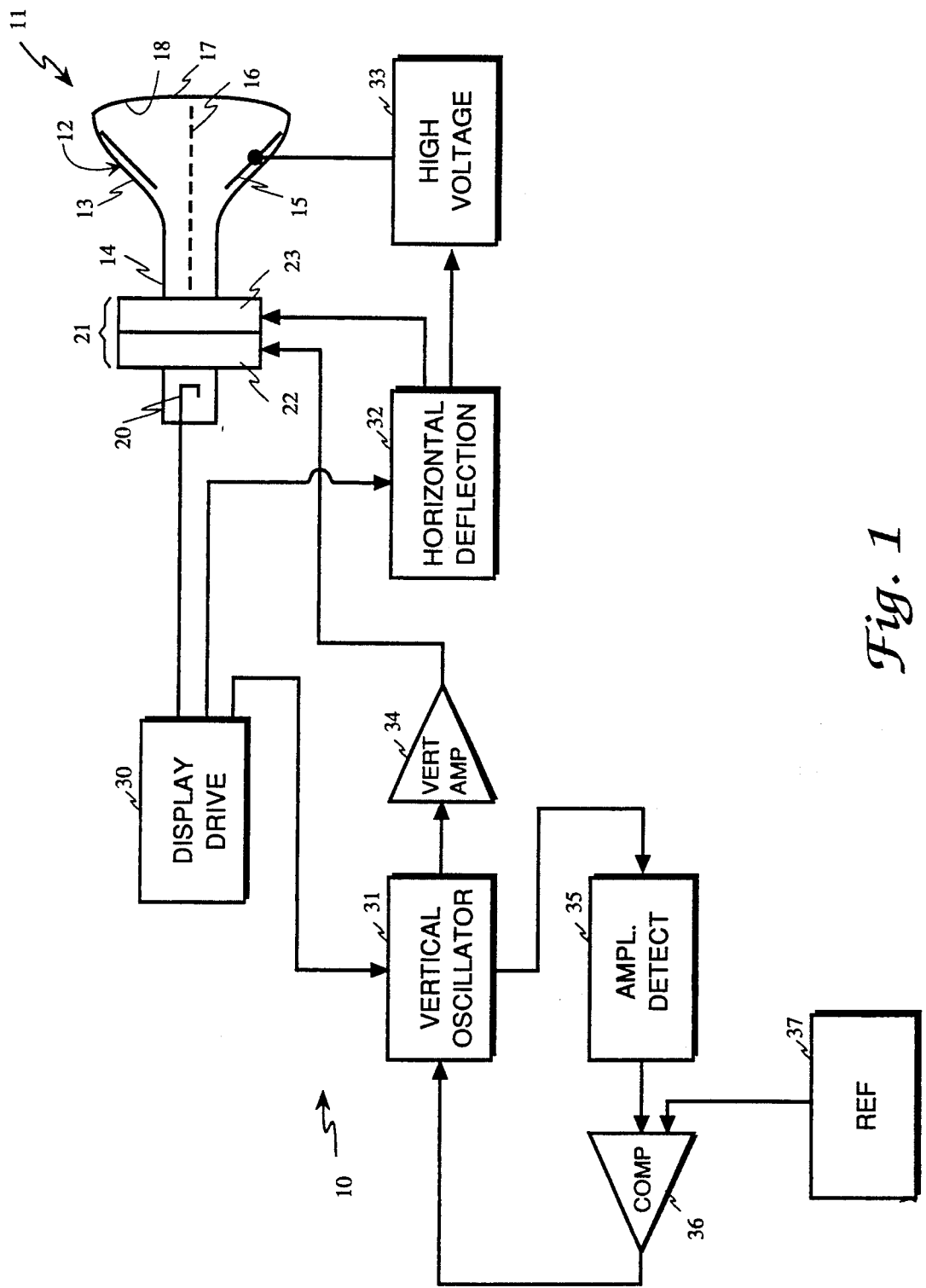
FIG. 1 sets forth a block diagram of a display monitor having a vertical deflection system constructed in accordance with the present invention.

FIG. 1 sets forth a block diagram of a display monitor constructed in accordance with the present invention and generally referenced by numeral 10. Display monitor 10 includes a conventional cathode ray tube 11 having an evacuated envelope 12 which includes a faceplate 17, a tapered funnel 13 and an elongated neck portion 14. In accordance with conventional fabrication techniques, an electron gun 20 is supported within neck 14 and is directed toward faceplate 17. A conventional high voltage electrode 15 is supported within envelope 12. A display drive 30 also constructed in accordance with conventional fabrication techniques includes circuitry for producing the video signals applied to electron gun 20 of CRT 11. A conventional yoke assembly 21 having a vertical deflection yoke 22 and a horizontal yoke 23 is supported upon envelope 12 and produces electromagnetic deflection fields within CRT 11. A vertical deflection oscillator 31 is coupled to a vertical amplifier 34 which in turn is coupled to vertical yoke 22. Vertical oscillator 31 is further coupled to an amplitude detector 35. A comparator 36 has a first input coupled to amplitude detector 35, a second input coupled to a source of reference voltage 37, and an output coupled to vertical oscillator 31. A horizontal deflection system 32 is coupled to horizontal yoke 23 and to display drive 30. A high voltage system 33 is coupled to high voltage electrode 15 and horizontal deflection system 32.

In operation, display drive 30, in accordance with conventional fabrication techniques, causes electron gun 20 to produce an intensity modulated stream of electrons formed into a CRT beam current 16. Electron beam 16 is directed toward faceplate 17 and phosphor screen 18 supported thereon. The electrons within CRT beam 16 are accelerated toward faceplate 17 by the high voltage present on electrode 15 and produce visible light as they strike phosphor screen 18. Horizontal deflection system 32 produces conventional horizontal scan signals which when applied to yoke 23 produce corresponding electromagnetic fields which in turn are operative upon CRT beam 16 causing side to side deflection thereof. As mentioned above, the horizontal scanning of CRT beam 16 causes it to be repeatedly scanned across faceplate 17 and retraced to its initial starting position. Vertical deflection system 31 produces vertical scan signals which are applied to vertical yoke 22 to produce corresponding electromagnetic fields within envelope 12 and deflect CRT beam 16 vertically between the top and bottom of faceplate 17. As is also described above, the vertical deflection of CRT beam 16 occurs more slowly than horizontal scan causing successive horizontal scans to progress downwardly with respect to faceplate 17 and to produce a scanned raster. Horizontal deflection 32 also produces a high amplitude short duration retrace pulse which is coupled to high voltage 33 and utilized to provide a high voltage accelerating potential at electrode 15. The purpose of the high voltage at electrode 15 is to provide the above-referenced acceleration of the electrons within CRT beam 16.

Thus, display drive 30, vertical deflection system 31, horizontal deflection system 32, high voltage system 33 and yoke 21 cooperate in accordance with conventional fabrication techniques to produce a scanned raster upon faceplate 17 of CRT 11. In further accordance with the process described above, display drive 30 also provides intensity modulation of CRT beam 16 to impart the desired image character to the image formed on faceplate 17. The proper display of the desired image is dependent, in part, upon the correct timing between the intensity modulations of CRT beam 16 and the vertical and horizontal scanning process. To facilitate this timing, synchronizing signals are produced by display drive 30 and applied to vertical deflection system 31 and horizontal deflection system 32.

The operation of amplitude detector 35, comparator 36 and reference supply 37 are set forth below in detail. However, suffice it to note here that a sample of the vertical scan signal produced by vertical oscillator 31 is converted to an amplitude indicative signal which is applied to one input of comparator 36. The remaining input of comparator 36 is maintained at a fixed reference potential. Comparator 36 produces an error signal proportional to the difference between input signals which is applied to vertical oscillator 31 to control the amplitude of vertical scan signal. In accordance with an important aspect of the present invention, reference source 37 permits operator selection of a standard display size format or an expanded display size format both of which are accurately defined and precisely maintained.

Figure 2:
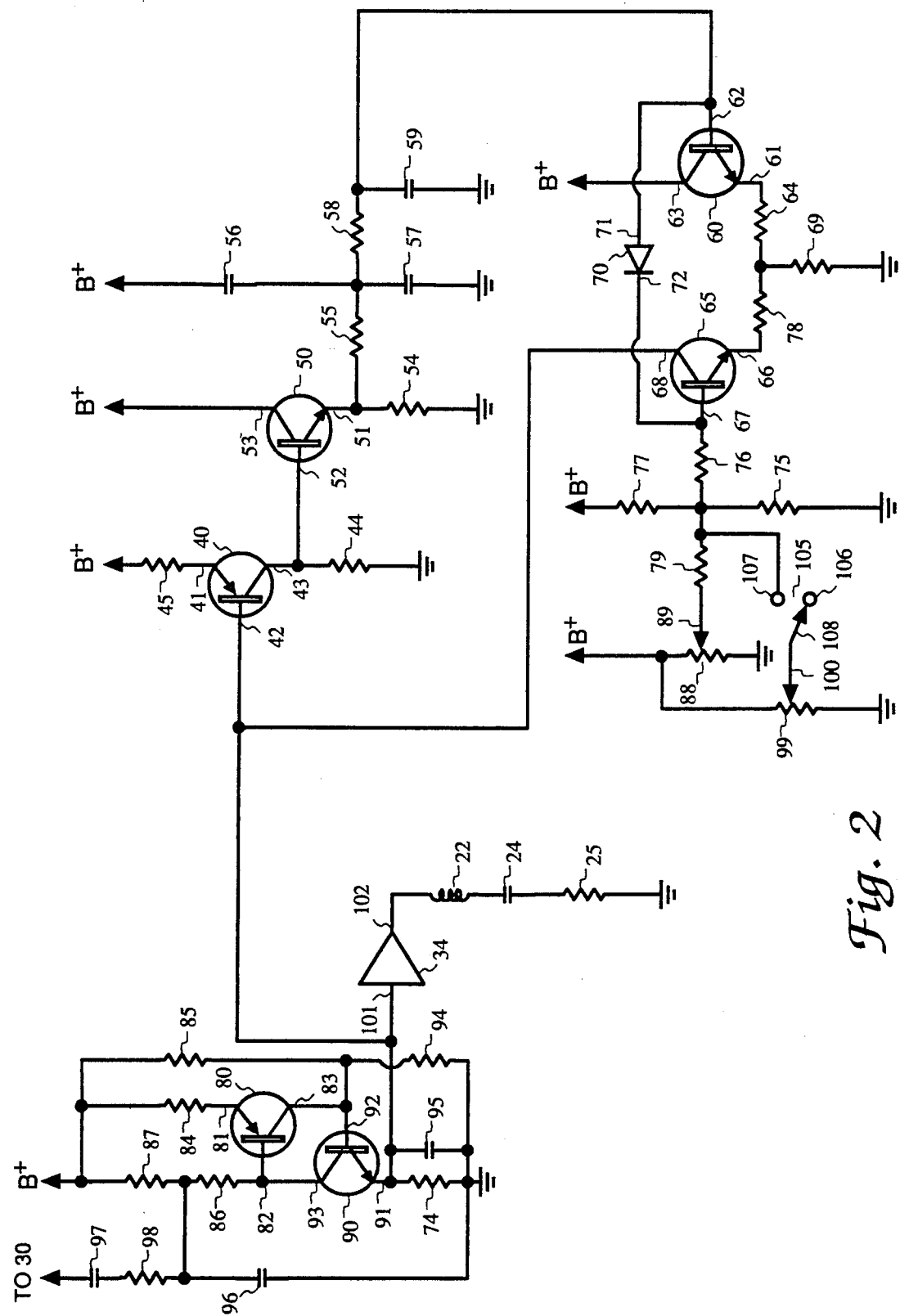
FIG. 2 sets forth a partial schematic, partial block diagram of the present invention multiple frequency vertical deflection system having size selection.

FIG. 2 sets forth a schematic diagram of the present invention multiple frequency vertical scan system. A PNP transistor 80 includes an emitter 81 coupled to a source of operating supply voltage by a resistor 84, a base 82 coupled to a source of operating supply voltage by a series pair of resistors 86 and 87, and a collector 83 coupled to ground by a resistor 94. Collector 83 is further coupled to a source of operating supply voltage by a resistor 85. An NPN transistor 90 includes an emitter 91 coupled to ground by a resistor 74, a base 92 coupled to collector 83 of transistor 80 and a collector 93 coupled to base 82 of transistor 80. A capacitor 95 is coupled in parallel with resistor 74 while a resistor 94 couples base 92 of transistor 90 to ground. A capacitor 96 couples the junction of resistors 86 and 87 to ground. A series combination of a resistor 98 and a capacitor 97 couples the junction of resistors 86 and 87 to display drive 30. A vertical output amplifier 34 includes an input 101 coupled to emitter 91 of transistor 90 and an output 102. A deflection yoke 22 is coupled to output 102 of vertical amplifier 34. A series combination of a capacitor 24 and a resistor 25 couple the remaining end of vertical deflection yoke 22 to ground.

A PNP transistor 40 includes an emitter 41 coupled to a source of operating supply by a resistor 45, a base 42 coupled to emitter 91 of transistor 90 and a collector 43 coupled to ground by a resistor 44. An NPN transistor 50 includes an emitter 51 coupled to ground by a resistor 54, a base 52 coupled to collector 43 of transistor 40, and a collector 53 coupled to a source of operating supply voltage. A pair of capacitors 56 and 57 are serially coupled between a source of operating supply voltage and ground. A resistor 55 is coupled between emitter 51 of transistor 50 and the junction of capacitors 56 and 57. A series combination of a resistor 58 and a capacitor 59 is coupled in parallel with capacitor 57.

An NPN transistor 60 includes an emitter 61, a base 62 coupled to the junction of resistor 58 and capacitor 59, and a collector 63 coupled to a source of operating supply voltage. An NPN transistor 65 includes an emitter 66, a base 67, and a collector 68 coupled to emitter 91 of transistor 90. A pair of resistors 64 and 78 are serially coupled between emitters 61 and 66 of transistors 60 and 65 respectively. A resistor 69 couples the junction of resistors 64 and 78 to ground. A diode includes an anode 71 coupled to base 62 of transistor 60 and a cathode 72 coupled to base 67 of transistor 65. A pair of resistors 75 and 77 are serially coupled between a source of operating supply voltage and ground. A resistor 76 couples the junction of resistors 75 and 77 to base 67 of transistor 65. A potentiometer 88 has one end coupled to a source of operating supply voltage and the remaining end coupled to ground. Potentiometer 88 further includes a movable contact 89 coupled to the junction of resistors 75 and 77 by a resistor 79. A potentiometer 99 is coupled between a source of operating supply voltage and ground. Potentiometer 99 further includes a movable contact 100. A switch 105 includes a stationary contact 107 coupled to the junction of resistors 75 and 77, a stationary contact 106, and a movable contact 108 coupled to movable contact 100 of potentiometer 99.

Figure 3A:
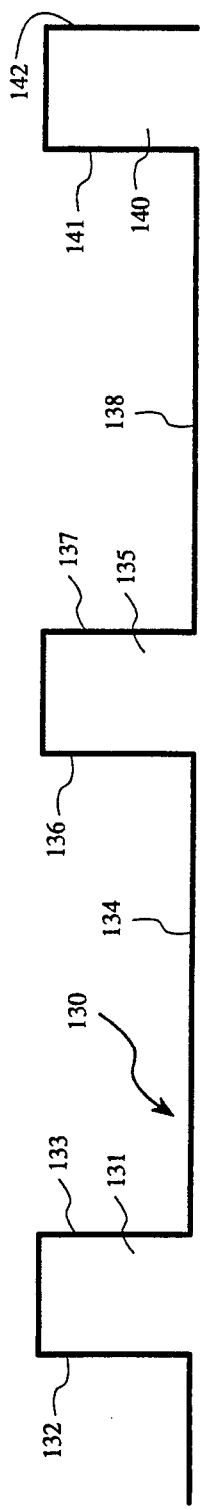
FIGS. 3a-3c sets forth exemplary signal waveforms relating to the operation of the system of FIG. 2.
Figure 3B:
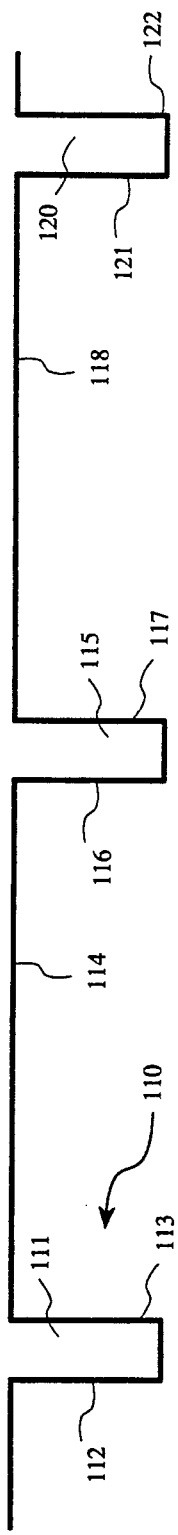
Figure 3C:
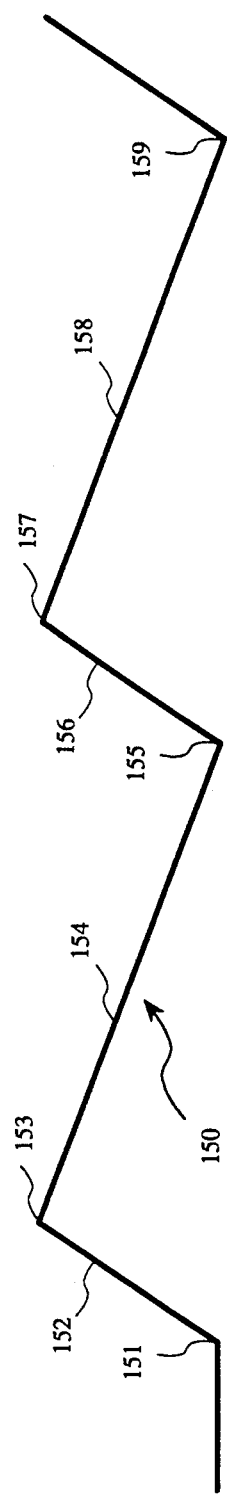

The operation of the circuit shown in FIG. 2 is believed best understood by initially discussing the basic operation of the vertical oscillator formed by transistor 80 and 90 together with their associated components. Thus, with simultaneous reference to FIGS. 2 and 3 and assuming saw forming capacitor 95 is initially discharged, emitter 91 of transistor 90 is near ground potential and the positive voltage provided by the resistive divider formed by resistors 85 and 94 forward biases transistor 90 causing it to conduct. As transistor 90 increases conduction, a voltage is developed across resistor 74 and a charge is accumulated in saw forming capacitor 95. Initially, PNP transistor 80 is nonconductive due to the positive voltage at its base 82 prior to the conduction of transistor 90. However, as transistor 90 continues to increase conduction, the collector current flow of transistor 90 produces a reduced voltage at base 82 of transistor 80. Once the voltage at base 82 decreases sufficiently to cause transistor 80 to begin conduction, the collector current of transistor 80 produces a greater forward bias voltage for transistor 90 due to the increased conduction through resistor 94. Thus, during the initiation of an oscillator cycle, the conductions of transistors 90 and 80 increase very rapidly producing a rapid charging of capacitor 95. With reference to FIGS. 3A and 3C, it should be noted that waveform 130 in 3A sets forth the oscillator conduction cycle while waveform 150 in FIG. 3C sets forth the saw waveform developed across capacitor 95. As transistors 80 and 90 increase conduction rapidly, a substantially vertical leading edge 132 is produced in waveform 130. Following this rapid increase in conduction, transistors 80 and 90 reach saturation and no further increases in conduction can occur. With reference to FIG. 3C, the rapid charging of capacitor 95 produces a sharply sloped charging voltage at emitter 91 of transistor 90. As the voltage at emitter 91 increases, voltage level 153 is reached which is sufficiently positive to turn off transistor 90. As transistor 90 turns off, the voltage at base 82 of transistor 80 rises sharply toward B plus which in turn turns off transistor 80. The drop in conduction of transistor 80 causes the voltage at base 92 of transistor 90 to decrease sharply which in turn further reduces the conduction of transistor 90. The process continues as transistors 80 and 90 rapidly cease conduction and a sharply decreasing voltage 133 is produced in waveform 130. Once transistor 90 ceases conduction, the capacitor 95 begins discharging through resistors 74 and transistor 65. As capacitor 95 discharges, waveform 150 in FIG. 3C assumes a downwardly sloped portion 154. The discharge of capacitor 95 continues until a point 155 is reached which reduces the voltage at emitter 91 of transistor 90 sufficiently below base 92 and transistor 90 is once again forward biased and begins conduction. Thereafter, the above-described sequence of events repeats in which the conduction of transistor 90 causes transistor 80 to begin conducting which in turn increases the conduction of transistor 90 and so on to produce leading edge 136 in waveform 130. Once again, as transistors 80 and 90 conduct, capacitor 95 is charged rapidly producing a vertically sloped component 156 in waveform 150 until a voltage level 157 is reached at which point the above-described turn off sequence is repeated and conduction of transistor 90 decreases which in turn decreases the conduction in transistor 80 and so on to produce the rapid decrease 137 in waveform 130 until transistors 80 and 90 are once again turned off. Thereafter, capacitor 95 again begins discharging through resistors 74 and transistor 65 to produce the next downwardly sloped waveform component 158 in waveform 150.

Thus, transistors 80 and 90 are operative to conduct for brief intervals shown as positive going pulses 131, 135 and 140 in waveform 3A and remain nonconducting for intervening periods 134 and 138. Correspondingly, during the periods of transistor conduction, the charging of capacitor 95 produces upwardly sloped portions 152, 156 and so on in waveform 150. During periods of nonconduction of transistors 80 and 90, the discharge of capacitor 95 produces interleaved downwardly sloping portions 154 and 158 in waveform 150. Portions 154 and 158 in waveform 150 correspond to the scan portions of the vertical scan cycle while upwardly sloped portions 152 and 156 correspond to the retrace interval of the vertical scan cycle. Thus, as transistors 80 and 90 are operative to produce brief conduction intervals during the retrace interval of the vertical scan signal, capacitor 95 is periodically charged during the retrace interval and permitted to discharge during the scan interval and thereby produce the desired vertical scan signal. This signal is then amplified by amplifier 34 and applied to vertical yoke 22 (seen in FIG. 1).

As described above, the proper display of information upon faceplate 17 of CRT 11 (seen in FIG. 1) requires the synchronization of CRT beam intensity modulation to raster scanning. To facilitate this timing, a series of synchronizing pulses shown in FIG. 3B as waveform 110 are coupled to base 82 of transistor 80 via resistor 98, capacitors 96 and 97 and resistor 86. As is seen in FIG. 3B, waveform 110 includes a series of negative going pulsed signals 111, 115 and 120. Pulse 111 comprises a sharply decreasing leading edge 112 and an increasing trailing edge 113.

In accordance with conventional fabrication techniques, a natural or free running frequency of oscillation for vertical deflection system 31 is designed to be slightly slower or lower in frequency than the desired vertical scan frequency. In its intended operation, the application of the negative going sync pulses of waveform 110 causes the vertical scan oscillator to be triggered during each vertical retrace interval. Specifically, waveform 110 is coupled to base 82 of transistor 80 by resistor 86. As waveform 110 decreases sharply during leading edge 112, a negative going signal is produced at base 82 of transistor 80 which forward biases it causing conduction. The conduction of transistor 80 produces a positive going voltage at base 92 of transistor 90 causing transistor 90 to conduct and initiate the above-described rapid turn on of transistors 80 and 90. With transistors 80 and 90 conducting, the positive going pulse 131 in waveform 130 is produced and the above-described charging and discharging of capacitor 95 takes place in the manner described above. The sole influence of the introduction of synchronizing signal is to provide the triggering of oscillator conduction. As a result, the timing of the oscillatory cycle of transistors 80 and 90 is no longer controlled by the rate of discharge of capacitor 95 but is instead controlled by the timing of the negative going synchronizing pulses within waveform 110. The amplitude of vertical scan signal, however, is controlled by the rate of discharge of capacitor 95 between synchronization pulses which in accordance with the invention is determined in part by the conduction of transistor 65.

With this understanding of the production of vertical scan signals within vertical deflection system 31, the operation of the present invention may now be more easily understood.

The vertical scan signal formed across saw forming capacitor 95 which is applied to input 101 of vertical output amplifier 34 is also coupled to base 42 of transistor 40. Transistor 40 amplifies the vertical scan signal to drive transistor 50. The positive going scan portion of the vertical signal is amplified by transistor 40 and coupled to transistor 50. Transistor 50 comprises an emitter follower amplifying stage in which the vertical rate scan signal is further coupled to the averaging network formed by capacitors 56, 57 and 59 together with resistors 55, 51 and 58. This detection of the vertical rate signal produces a DC voltage across capacitor 59 which is proportional to the peak voltage or amplitude of the input scan signal. Since amplifier 34 drives deflection yoke 22 with this same signal, the voltage across capacitor 59 is proportional to and varies directly with the amplitude of vertical scan signals applied to vertical deflection yoke 22. This scan amplitude indicative signal is coupled to base 62 of transistor 60.

Transistors 60 and 65 are configured to form a differential amplifier having inputs at bases 62 and 67 thereof. Accordingly, the output voltage of the differential amplifier thus formed at collector 68 represents the difference between the DC voltages applied to bases 62 and 67 of differentially configured transistors 60 and 65. In accordance with an important aspect of the present invention, a DC reference voltage is applied to base 67 by either or both of potentiometers 88 and 99. In the configuration shown in FIG. 2, switch 105 is positioned in accordance with the normal scan mode of operation in which no expanded or overscanned condition is desired. As a result, the DC reference voltage at base 67 is established solely by adjustment of potentiometer 88. This adjustment is carried forward to produce a reference voltage at base 67 which provides the appropriate conduction of transistor 65 to establish the correct vertical scan height for the normal or conventional operation of the display monitor. Thereafter, deviation of the vertical scan amplitude from the desired setting is controlled by the system in the following manner. Any increase of vertical scan signal applied to vertical yoke 22 is simultaneous with an increased voltage developed across capacitor 95. This increased voltage is amplified by transistors 40 and 50 and detected by the detector network comprising capacitors 56, 57 and 59 together with resistors 51, 55 and 58. The detection of the increased scan signal produces an increased forward bias upon transistor 60 which is compared by the differential amplifier formed by transistors 60 and 65 to the referenced voltage at base 67. Since the voltage at base 62 is now greater with respect to the voltage at base 67, the conduction of transistor 65 is decreased which causes capacitor 95 to discharge more slowly during the vertical scan interval. The decreased discharge of capacitor 95 reduces the output amplitude of the vertical oscillator. As a result, less vertical deflection signal is generated and a corrective change of vertical scan amplitude results. Conversely, in the event the amplitude of vertical scan signal applied to vertical yoke 22 decreases below the established amplitude, the voltage developed at emitter 91 is similarly decreased. This reduced amplitude sampled signal is amplified by transistors 40 and 50 and detected thereafter establishing a reduced voltage at base 62. The reduced voltage at base 62 reduces the conduction of transistor 60 which in turn causes an increase in conduction of transistor 65. The increased conduction of transistor 65 discharges capacitor 95 more rapidly which increases the amplitude of vertical scan signal produced by the vertical oscillator and applied to deflection yoke 22. Thus, a compensating correction of vertical scan signal amplitude takes place.

Thus, the amplitude of vertical scan signal in deflection yoke 22 may be controlled by adjustment of the voltage upon base 67 of transistor 65. Accordingly, potentiometer 88 may be utilized to provide vertical size adjustment in the normal mode of display monitor operation. Once potentiometer 88 is adjusted, the vertical scan system stabilizes in accordance with the voltage maintained at base 67 and changes thereof are automatically corrected in the manner described above.

In accordance with an important aspect of the present invention, a second potentiometer 99 is selectively coupleable through switch 105 to base 67 of transistor 65. Thus, in the event movable contact 108 of switch 105 is moved into connection with contact 107, potentiometer 99 is coupled to base 67. Thus, the voltage under such conditions at base 67 may be further adjusted by adjustment of potentiometer 99 without disturbing the previously described adjustment of potentiometer 88. In further accordance with the present invention, potentiometer 99 is adjusted to establish a reference voltage at base 67 of transistor 65 which corresponds to an increased amplitude of vertical deflection signal. This increased amplitude of vertical deflection signal achieves the above-described image expansion or overscan. The degree of expansion or overscan may be adjusted completely by manipulation of potentiometer 99. Once the desired voltage is established at base 67 of transistor 65 by adjustment of potentiometer 99, the above-described stabilizing operation of the circuit of FIG. 2 maintains the amplitude of vertical scan signal applied to vertical yoke 22 in accordance with the adjustment.

With potentiometers 88 and 99 thus adjusted, the present invention vertical scan system may be selectively configured in normal scan or expanded scan by simply moving contact 108 of switch 105. Thus, the present invention system provides accurate maintainable stable vertical scan sizes for either normal or expanded modes of operation.

In accordance with a further advantage of the present invention system, the control system of FIG. 2 compensates for changes of vertical scan frequency to maintain constant vertical scan amplitude. As can be seen, the detection of vertical scan signal sampled at capacitor 95 assures that the control system of the present invention responds solely to peak signal amplitude and is thus unaffected by the frequency of scan signal. Accordingly, the vertical scan system may be operated over a wide range of vertical scan frequencies without image size changes.

What has been shown is a vertical scan system operable in both normal and expanded image modes of operation which is virtual impervious to changes of vertical scan frequency. The vertical size is maintained regardless of frequency changes, temperature changes or component aging. The system uses a detected sample of the vertical deflection signal to drive a closed loop control system and maintain constant scan signal amplitude. Because the sense point and control are at the same point (capacitor 95), the loop remains closed for automatic gain control action within itself at the oscillator so as not to interact with other loops in the vertical deflection system. The adjustment of scan amplitudes in normal and expanded modes may be independently made with little or no interaction.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. A vertical scan control system for use in a cathode ray tube display having a vertical deflection yoke and a vertical deflection system including a saw-forming capacitor and an oscillator operative thereon to periodically charge the saw-forming capacitor and conductive element for discharging the saw-forming capacitor for producing vertical deflection current in the deflection yoke, said vertical scan control system comprising:
    sensing means coupled to said saw-forming capacitor for producing a sample vertical deflection signal representative of the current within the vertical deflection yoke;
    amplitude detecting means coupled to said sensing means for producing a control signal proportional to the amplitude of said sample signal;
    reference voltage means producing first and second reference voltages corresponding to first and second predetermined vertical deflection current amplitudes;
    comparator means having a first input coupled to said amplitude detecting means and a second input producing an output signal representative of the difference between signals applied to said first and second inputs;
    a switch for selectively coupling said first or second reference voltages to said second input of said comparator means; and
    amplitude means including an active element coupled to said saw-forming capacitor having a conduction level responsive to the output of said comparator means for altering the amplitude of vertical deflection current produced by the vertical deflection system by altering the discharge of said saw-forming capacitor.

2. A vertical scan control system as set forth in claim 1 wherein said amplitude detecting means includes a detector network.

3. A vertical scan control system as set forth in claim 2 wherein comparator means includes a differential amplifier having first and second transistors having first and second common electrodes coupled to a common impedance, first and second input electrodes coupled to said switch and said amplitude detecting means, and first and second output electrodes.

4. A vertical scan control system as set forth in claim 3 wherein said first output electrode of said first transistor is coupled to said saw-forming capacitor altering the charging and discharging of the saw-forming capacitor by changes of first transistor conduction level between first output and common electrodes.

5. A vertical scan control system as set forth in claim 4 wherein said reference voltage means include first and second potentiometers coupled to a source of operating supply voltage and having respective first and second adjustable contacts each coupled to said switch.

6. For use in a vertical deflection system for a cathode ray tube display in which a vertical deflection system includes a vertical oscillator having a saw-forming capacitor and produces vertical deflection currents within to a vertical deflection yoke at a plurality of selected frequencies, a vertical scan control system comprising:
    sensing means coupled to the saw-forming capacitor of the vertical oscillator for producing an output signal representative of the vertical oscillator signal;
    a reference DC voltage source; and
    a differential amplifier having first and second differential inputs coupled to said sensing means and said DC reference source respectively and having an active output stage coupled to said saw-forming capacitor having a conduction level responsive to the difference between the signals coupled to said first and second inputs to produce amplitude stabilizing changes within the vertical deflection system.

7. A vertical scan control system as set forth in claim 6 wherein said reference DC voltage source produces first and second DC reference voltages and a switch for selectively coupling said first and second DC reference voltages to said second input of said differential amplifier.

* * * * *